United States Patent
Suzuki et al.

(10) Patent No.: US 6,869,743 B1
(45) Date of Patent: Mar. 22, 2005

(54) METHOD OF PROCESSING LIGHT-SENSITIVE MATERIAL

(75) Inventors: Shigeyoshi Suzuki, Tokyo (JP); Yasuo Tsubai, Tokyo (JP); Sadao Kuriu, Tokyo (JP); Toshihito Maruyama, Tokyo (JP); Kenji Hirata, Tokyo (JP); Masato Asano, Tokyo (JP); Masahiko Saikawa, Tokyo (JP); Akira Furukawa, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 184 days.

(21) Appl. No.: 09/712,182

(22) Filed: Nov. 15, 2000

(30) Foreign Application Priority Data

| Nov. 16, 1999 | (JP) | ............................................ 11-324971 |
| Nov. 16, 1999 | (JP) | ............................................ 11-324972 |
| Mar. 30, 2000 | (JP) | ...................................... 2000-095592 |
| Jul. 13, 2000 | (JP) | ...................................... 2000-212565 |

(51) Int. Cl.$^7$ ................................................. G03C 8/50
(52) U.S. Cl. ....................... 430/259; 430/256; 430/204; 430/208; 430/212; 430/230; 101/463.1; 101/453; 101/454
(58) Field of Search ............................... 430/204, 208, 430/212, 227, 230, 231, 256, 259, 278, 300, 302, 304, 309; 101/463.1, 453, 454

(56) References Cited

U.S. PATENT DOCUMENTS

| 2,732,316 | A | * | 1/1956 | July et al. ..................... 117/62 |
| 2,983,611 | A | * | 5/1961 | Allen et al. .................... 96/111 |
| 3,017,280 | A | * | 1/1962 | Yudelson et al. ........... 106/125 |
| 3,091,537 | A | * | 5/1963 | Burness et al. ............... 96/111 |
| 3,100,704 | A | * | 8/1963 | Coles et al. ................... 96/111 |
| 3,103,437 | A | * | 9/1963 | Henn et al. .................... 96/111 |
| 3,728,114 | A | * | 4/1973 | Futaki et al. .................. 96/29 |
| 4,567,131 | A | * | 1/1986 | Watkiss ...................... 430/309 |
| 4,775,614 | A | * | 10/1988 | De Rycke .................... 430/390 |
| 4,830,949 | A | * | 5/1989 | De Rycke .................... 430/206 |
| 4,888,267 | A | * | 12/1989 | De Rycke .................... 430/206 |
| 5,068,165 | A | * | 11/1991 | Coppens et al. ............ 430/204 |
| 5,213,943 | A | * | 5/1993 | Coppens et al. ............ 430/231 |
| 5,273,858 | A | * | 12/1993 | Coppens et al. ............ 430/204 |
| 5,362,602 | A | * | 11/1994 | Coppens et al. ............ 430/262 |
| 5,427,889 | A | * | 6/1995 | Saikawa et al. ............ 430/204 |
| 6,403,282 | B1 | * | 6/2002 | Mayers et al. ........... 430/273.1 |

* cited by examiner

*Primary Examiner*—Yvette C. Thornton
(74) *Attorney, Agent, or Firm*—Paul E. White, Jr.; Manelli Denison & Selter PLLC

(57) ABSTRACT

There is disclosed a method of processing a light-sensitive material which comprises exposing a light-sensitive material having at least one light-sensitive layer on a support, and subjecting to development by a dipping system or a coating system, and then, peeling at least the light-sensitive layer off by bringing a peeling material into close contact with the light-sensitive material, wherein the peeling material is a material having a liquid-absorbing rate in which a liquid-absorption amount within 0.1 second after getting in contact with a liquid is 60% or more based on a liquid-absorption amount within 0.2 second after the same.

16 Claims, 1 Drawing Sheet

METHOD OF PROCESSING LIGHT-SENSITIVE MATERIAL

BACKGROUND OF THE INVENTION

1. Field of the Invention

This invention relates to a method of processing a light-sensitive material by bringing a peeling means into close contact with the material in place of effecting washing off of the light-sensitive layer (for example, a silver halide emulsion layer or a non-silver salt light-sensitive layer) of the light-sensitive materials. Particularly, it relates to a processing method preferably employed for making an aluminum lithographic printing plate utilizing a silver complex diffusion transfer process which uses an anodized aluminum plate as a support.

2. Prior Art

With regard to a lithographic printing plate using a silver complex diffusion transfer process (the DTR method), some examples are described on pages 101 to 130 of André Rott and.

Edith Weyde, "Photographic Silver Halide Diffusion Processes", published by the Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two sheet type lithographic printing plate is described in detail in Japanese Provisional Patent Publication No. 158844/1982. Also, the mono-sheet type is described in detail in U.S. Pat. No. 3,728,114.

The mono-sheet type lithographic printing plate utilizing the silver complex diffusion transfer process with the use of an aluminum plate as a support (hereinafter referred to as "an aluminum lithographic printing plate") is described in detail in Japanese Provisional Patent Publications No. 118244/1982, No. 158844/1982, No. 260491/1988, No. 116151/1991 and No. 282295/1992, and U.S. Pat. No. 4,567,131 and No. 5,427,889.

In the above-mentioned aluminum lithographic printing plate, physical development nuclei are carried on a roughened and anodized aluminum support, and a silver halide emulsion layer is further provided thereon. A general process for making this lithographic printing plate comprises the steps of exposure, DTR development processing, water washing processing (washing off: removal of a silver halide emulsion layer with washing solution) and finishing processing.

More specifically, a metal silver image portion is formed on the physical development nuclei by the development processing and the silver halide emulsion layer is removed by the subsequent washing processing to expose the metal silver image portion (hereinafter referred to as a "silver image portion"). Simultaneously, the anodized aluminum surface itself is exposed as a non-image portion.

After the washing processing, a finishing solution containing a protective colloid such as gum arabic, dextrin, carboxymethyl cellulose, polystyrenesulfonic acid, etc. is coated on the exposed silver image portion and the non-image portion for protecting the same. A processing of the so-called gum coating is applied to the surface of the plate. The finishing solution is also called as a fixing solution and it is general that it contains a compound which makes the silver image portion oleophilic such as a nitrogen-containing heterocyclic compound having a mercapto group or a thione group (hereinafter referred to as an "oleophilic agent").

The above-mentioned aluminum lithographic printing plate has a merit that a printing plate excellent in printing endurance can be easily obtained as compared with a lithographic printing plate in which a subbing layer, a silver halide emulsion layer and a physical development nuclei layer are provided in this order on a flexible support such as a film or a polyethylene-coated paper, etc., but it involves various kinds of problems.

On of the problems is that the silver halide emulsion layer, etc. are removed by a washing solution so that it is necessary to treat and dispose a large amount of a washing solution containing gelatin or silver, etc. which becomes one of the serious environmental or economical problems.

To solve the above-mentioned problems, there are proposed to peel off an emulsion layer by bringing a peeling sheet into close contact with the emulsion layer to peel off the emulsion layer in U.S. Pat. No. 5,068,165 and No. 5,213,943, and Japanese Provisional Patent Publication No. 318553/1992. More specifically, peeling sheets comprising a substrate and a gelatin layer or a cured gelatin layer containing a matte agent coated on the substrate are shown. However, the peeling sheets in the specific examples have defects that they not only require a long contacting time until peeling off thereof.

Another problem is that an amount of waste liquor of the developing solution is large. That is, a developing solution containing a developing agent such as hydroquinone, etc. has been used for making an aluminum lithographic printing plate. In this developing solution, a relatively large amount of the developing solution must be replenished compulsorily so that an excessive developing solution overflowed is exhausted and disposed. Thus, an amount of the developing solution to be used for developing the aluminum lithographic printing plate per unit area becomes large as compared with the lithographic printing plate using a flexible support. And yet, when a developing solution is used for a predetermined running processing time, the used developing solution must be changed to a new developing solution. Thus, there are environmental and economical problems since such a large amount of the developing solution must be disposed of as a waste solution.

A further problem is that an aluminum oxide layer of an anodized aluminum support is dissolved by an action of a high pH developing solution, so that changes in developing conditions affect to formation of DTR development silver so that a lithographic printing plate having good printing properties cannot be made stably.

On the other hand, a light-sensitive material comprising a light-sensitive composition containing no silver salt has been known. This light-sensitive composition causes chemical change of a molecular structure by photoreaction (irradiation of UV rays or visible rays), and as a result, changes are caused in physical phenomenon (physical properties). As a chemical change due to an action of light, there are cross-linking, polymerization, decomposition, decomposition polymerization, functional group-modification, etc., and also there are various factors such as solubility, adhesiveness, refractive index, substance permeability and phase change, etc. Such a light-sensitive composition has practically been used in a broad field such as a printing plate, resist, paint, coating agent, color filter, etc. Moreover, it has been used in the field of photoresist using a photographic plate-making technology (photolithography)

and developed. The photoresist is to utilize change in solubility due to the photoreaction.

As an example in which a light-sensitive material comprising the above-mentioned photosensitive composition is applied to a lithographic printing plate, it has been generally known a PS plate (which is an abbreviation of "Presensitized Plate") in which a light-sensitive resin layer is provided on an aluminum support. In the PS plate, there are two types of a negative type and positive type materials. The negative type material is to cure an exposed portion and remove an unexposed portion by dissolving the portion using a developing solution whereby a cured film (exposed portion) is formed on the aluminum support with a shape depending on an exposure pattern. The positive type material is contrary to the above, to solve an exposed portion by a developing solution whereby a film (unexposed portion) is formed on the aluminum support depending on an exposure pattern.

As materials for making the PS plates as mentioned above, there are described in detail, for example, in "Outline of PS plate", written by Teruhiko Yonezawa (published by Insatsu Gakkai Shuppannbu, Japan), "Light-sensitive polymer", written by Gentaro Nagamatsu and Hideo Inui (published by Kodansha, Japan) or "Photopolymer Technology" written by Tsuguo Yamaoka and Gentaro Nagamatsu (published by Nikkan Kogyo, Japan).

Also, in addition to the above-mentioned PS plate, there is a lithographic printing plate to be used in a CTP (Computer To Plate) system. The CTP system is a system in which original data converted into digital information are directly subjected to image exposure to a printing plate by using a laser beam. As a light source, helium-neon laser, argon laser, near infrared semiconductor laser, YAG laser, etc., have been frequently utilized.

As a printing plate for CTP as mentioned above, a printing plate which is capable of effecting laser beam exposure utilizing a photopolymerization reaction containing a polymerizable monomer has been known. It has been explained in, for example, written by Shigeki Shimizu, "Insatsu Zasshi", vol. 78, p. 9, 1995, etc. Also, in Japanese Patent Publication No. 105353/1994 or Japanese Provisional Patent Publication No. 230594/1997, an example of a photopolymerizable composition comprising a polymer into which a polymerizable unsaturated bonding group having a specific structure is introduced at a side chain, a photopolymerization initiator and a compound having at least one of an ethylenically unsaturated bond.

As examples of light-sensitive compositions for forming a negative type image by utilizing a laser beam, there may be mentioned, for example, in Japanese Provisional Patent Publications No. 90885/1998, No. 127694/1997 and No. 138500/1997, etc., and as for the use particularly of a lithographic printing plate, thee may be mentioned those described in Japanese Provisional Patent Publications No. 20629/1997, No. 271029/1995, No. 244226/1997, No. 212252/1999 and No. 231535/1999, etc. Of these, lithographic printing plates having a light-sensitive layer basically containing a phenol resin, a light Absorbent and an acid generator. Such a lithographic printing plate is, for example, subjected to exposure with a high output laser, etc., so that solubility of the phenol resin to a developing solution changed by an acid generated from the acid generator due to change in cross-linking density, etc., is utilized.

The light-sensitive material comprising the above-mentioned light-sensitive composition involves a problem that components of a developing solution change with a lapse of time since a not-cured light-sensitive layer is dissolved in the developing solution and removed, so that much amount of a replenishing solution for the developing solution is required whereby an amount of a waste solution becomes large.

SUMMARY OF THE INVENTION

Accordingly, the first object of the present invention is to provide a method of processing a light-sensitive material which can uniformly and completely remove the light-sensitive layer comprising a silver halide emulsion or a light-sensitive composition containing no silver salt within a short period of time. Another object of the present invention is to provide a method of processing a light-sensitive material which can uniformly and completely remove the light-sensitive layer within a short period of time without using a washing solution (so that there is no waste solution of the washing solution). Still further object of the present invention is to provide a method of making a plate which can prepare an aluminum lithographic printing plate excellent in printing characteristics in a stable manner and a low cost without causing environmental pollution due to markedly reducing or substantially no waste solution of the developing solution.

The above objects of the present invention can be accomplished by a method of processing a light-sensitive material which comprises exposing a light-sensitive material having at least one light-sensitive layer on a support, and subjecting to development by a dipping system or a coating system, and then, peeling at least the light-sensitive layer off by bringing a peeling means into close contact with said light-sensitive material, wherein said peeling means is a material having a liquid-absorbing rate in which a liquid-absorption amount within 0.1 second after bringing into contact with a liquid is 60% or more based on a liquid-absorption amount within 0.2 second after the same.

Also, the present invention is preferably used for making a lithographic printing plate utilizing a silver complex diffusion transfer process having at least a silver halide emulsion layer on an anodized aluminum support. Such a method of making a lithographic printing plate comprises exposing a lithographic printing plate and subjecting to development treatment by coating a developing solution, and then, bringing a peeling means into close contact with said lithographic printing plate and peeling at least the silver halide emulsion layer. Moreover, the processing method of the present invention can be applied to a light-sensitive material having a non-silver light-sensitive layer (a light-sensitive layer comprising a light-sensitive composition containing no silver salt).

DESCRIPTION OF THE PREFERRED EMBODIMENTS

Figure 1:
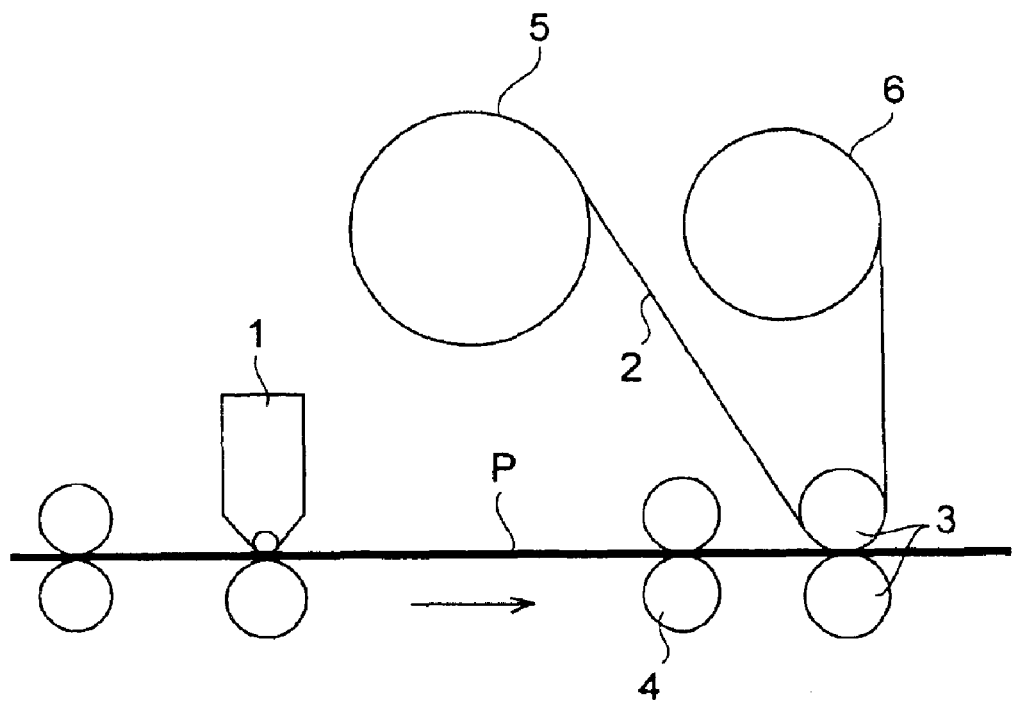
FIG. 1 is a sectional outline view showing one example of a plate-making apparatus to be used in the processing method of the present invention.

The method of processing a light-sensitive material of the present invention comprises exposing the light-sensitive material and subjecting it to development treatment, and after that, peeling at least the light-sensitive layer off by bringing a peeling means into close contact with the light-sensitive material. By peeing the light-sensitive layer off according to the method of the present invention, the light-sensitive layer can be uniformly and completely peeled off within a short period of time. Also, in a lithographic printing plate having a silver halide emulsion layer, a washing solution is not required. Also, in a light-sensitive composition containing no silver salt, compositions of the developing solution are liable to be not changed so that development can be carried out in a stable manner. Moreover, a large amount of a replenishing solution for the developing solution is not required.

In the present invention, the developing treatment may be a dipping development system in which a light-sensitive material is dipped in a developing solution or a coating development system in which a developing solution is coated on the light-sensitive material. The latter coating development system is preferred in the present invention.

Coating of the developing solution can be carried out by using a coating apparatus of a developing solution as disclosed in, for example, Japanese Provisional Patent Publications No. 76603/1973, No. 289343/1993, No. 27680/1994, No. 27682/1994, No. 62952/1998 and No. 62951/1998. By using such a coating development system, an amount of the waste liquor of the developing solution can be made substantially zero or markedly reduced.

The peeling means of the present invention comprises a material having a void layer in which fine particles such as silica, alumina, etc. are dispersed on a substrate. Also, the peeling means of the present invention is a material having characteristics of a fast liquid-absorbing rate in which a liquid-absorption amount within 0.1 second after getting in contact with a liquid is 60% or more based on a liquid-absorption amount within 0.2 second after the same. Moreover, the peeling means of the present invention is a material (a peeling sheet) having characteristics of a high liquid-absorption capacity wherein a liquid-absorption amount within 0.1 second after getting in contact with a liquid is 10 ml or more per 1 $m^2$ of the peeling sheet.

As a preferred example of the method of making a plate using the peeling means of the present invention, there may be mentioned a method in which by using an apparatus having a coating means of a developing solution and the above-mentioned peeling sheet, a developing solution in an amount necessary for development is coated on the surface of a plate of a lithographic printing plate using a silver complex diffusion transfer process having at least silver halide emulsion layer on an anodized aluminum support. Subsequently, when the development is completed, said peeling sheet is contacted with the surface of the plate so that hydrophilic colloid layers such as the silver halide emulsion layer, etc., are uniformly and completely removed from the aluminum support within a short period of time.

The present invention is not adhered to an inference but the functional mechanism of the present invention can be expected as mentioned below. That is, a developing solution is retained at the inside of the hydrophilic colloid layer of the developed aluminum lithographic printing plate and on the surface of the plate. When the peeling means of the present invention is bringing into close contact therewith, said peeling means is bringing into close contact with the surface of the lithographic printing plate by rapidly absorbing the developing solution from an upper side of said lithographic printing plate with a large amount. To peel off the hydrophilic colloid layer from the support, it is necessary that an adhesive force between the peeling means and the lithographic printing plate surface is larger than that of the hydrophilic colloid layer and the support. Thus, when peeling is started during the term wherein the developing solution at the lower portion (the portion close to the support) of the hydrophilic colloid layer of said printing plate is adsorbed with not so much amount by the peeling means (i.e., a concentration of the developing solution is higher at the under portion than that of the upper portion, in other words, there is a concentration gradient of the developing solution in the layer), the hydrophilic colloid layer is removed uniformly and completely from the support.

In the following, the present invention will be explained in more detail by mainly referring to the method of making an aluminum lithographic printing plate. The lithographic printing plate to be used in the present invention generally has a physical development nuclei layer and at least silver halide emulsion layer in this order on an aluminum support. However, it has been known that DTR development can be carried out without using the physical development nuclei layer so that it is not necessarily used. As the aluminum support of the aluminum lithographic printing plate to be used in the present invention, those containing 1.0 g or more per 1 $m^2$ of porous aluminum oxide, preferably 1.5 g to 5 g of the same per 1 $m^2$ are used.

As the physical development nuclei in a physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of palladium, zinc and the like with a sulfide, and so on. As a protective colloid, various hydrophilic colloids may be used. With respect to details of the physical development nuclei and preparation process thereof, reference can be made to, for example, Andre Rott and Edith Weyde, "photographic Silver Halide Diffusion Processes", published by the Focal Press, London and New York (1972).

The silver halide emulsion may be selected from silver chloride, silver bromide, silver iodide, silver chlorobromide, silver chloroiodobromide, silver iodobromide, etc., which are generally employed, and that mainly comprising silver chloride (which means 50 mol % or more of silver chloride) is preferred. Also, as a type of the emulsion, it may be either a negative type or a positive type. These silver halide emulsions may be chemically sensitized or spectral sensitized, if necessary.

In the silver halide emulsion layer, various kinds of anionic, cationic, betain or nonionic surfactants; antifogging agents such as mercaptotetrazole, etc.; chelating agents such as ethylenediamine tetraacetate, etc.; developing agents such as hydroquinone, 3-pyrazolidinones, etc., may be contained, if necessary.

As the hydrophilic colloid of the silver halide emulsion layer, gelatin is preferably used for preparing silver halide particles. As the gelatin, there may be used various gelatins such as acid-treated gelatin and alkali-treated gelatin. Also, modified gelatins thereof (e.g., phthalated gelatin and amidated gelatin) can be used. Further, a hydrophilic high molecular weight compound such as polyvinyl pyrrolidone, various starches, albumin, polyvinyl alcohol, gum arabic and hydroxyethyl cellulose can be contained. As the hydrophilic colloid to be used, a hydrophilic colloid substantially containing no hardener is desirably used.

The silver halide emulsion layer to be used in the present invention preferably contains 70% by weight or less, more preferably 60% to 20% by weight of a hydrophilic colloid based on the amount of the silver halide in terms of silver nitrate. When the silver halide emulsion layer which contributes to light-sensitivity comprises two or more layers, an amount of the hydrophilic colloid is controlled within the above range based on the total weight of the silver halide and an average weight ratio of the hydrophilic colloid.

In the aluminum lithographic printing plate of the present invention, a coated amount of the silver halide in terms of silver nitrate is preferably within the range of 0.5 g to 5 g per $m^2$.

When the above-mentioned high silver density emulsion is used, a coating amount of a developing solution can be markedly reduced so that an amount of the developing solution to be disposed can be also markedly reduced. Moreover, a tolerance of the developing conditions due to change in environmental conditions is enlarged and a developing time can be shortened (rapid development). Furthermore, an amount of the silver halide to be coated can be markedly reduced and yet a lithographic printing plate excellent in printing characteristics can be obtained.

In the present invention, it is preferred to provide a protective layer comprising a hydrophilic colloid on the silver halide emulsion layer. By forming the protective layer, development can be carried out from the top of the aluminum lithographic printing plate to which a developing solution is coated without causing development unevenness whereby a coating amount of the developing solution can be reduced as a result of improvements in transfer rate and transfer efficiency. Moreover, close contact with the peeling means can be more improved, and peeling of an emulsion layer can be carried out more completely within a short period of time. Furthermore, a waste solution of the developing solution is not substantially generated and a lithographic printing plate excellent in printing characteristics can be obtained.

As the hydrophilic colloid for the protective layer as mentioned above, there may be used hydrophilic colloids such as various kinds of gelatins mentioned in the silver halide emulsion, polyvinylpyrrolidone, various kinds of starches, albumin, polyvinyl alcohol, gum arabic, hydroxyethyl cellulose, and the like, singly or in combination of two or more.

An amount of the hydrophilic colloid for the protective layer to be coated is preferably in the range of 0.1 g to 3 g, more preferably 0.3 g to 2 g per $m^2$ of the aluminum lithographic printing plate. The protective layer may be a plural number of layers of two or more.

In the present invention, a water swellable intermediate layer as described in U.S. Pat. No. 5,068,165 and No. 5,213,943 or an intermediate layer containing hydrophobic polymer beads as described in U.S. Pat. No. 5,273,858 and No. 5,362,602 may be provided between the physical development nuclei layer and the silver halide emulsion layer.

The aluminum lithographic printing plate of the present invention preferably contains an organic carboxylic acid in at least one layer among the silver halide emulsion layer, the physical development nuclei layer, the protective layer and the intermediate layer. It is more preferred that the organic carboxylic acid is contained in a silver halide emulsion layer or an intermediate layer. The organic carboxylic acid is preferably a polycarboxylic acid having two or more carboxy groups (which may be a salt) in the molecule.

As the organic carboxylic acid to be used in the present invention, there may be mentioned, for example, an organic acid such as citric acid, phthalic acid, salicylic acid, caproic acid, adipic acid, succinic acid, maleic acid, fumaric acid, DL-malic acid, DL-aspartic acid, L-glutamic acid, benzoic acid, cinnamic acid, α-methylcinnamic acid, β-naphthonic acid, malonic acid, erythorbic acid, tartaric acid, etc.

An amount of these organic carboxylic acid may vary depending on the kind of the carboxylic acid, the layer to be added, and other conditions, but generally within the range of 0.01 mmol to 10 mmol, preferably 0.05 mmol to 5 mmol per $m^2$ of the aluminum lithographic printing plate. The organic carboxylic acid(s) may be added to two or more layers and the respective organic carboxylic acids may be the same or different in the respective layers.

The developing solution to be used in the present invention may comprise a developing agent such as polyhydroxybenzenes including hydroquinone, etc., 3-pyrazolidinones including 1-phenyl-3-pyrazolidinone and its derivatives; an alkaline substance such as potassium hydroxide, sodium hydroxide, lithium hydroxide, sodium tertiary phosphate and amine compounds; a preservative such as sodium sulfite; a viscosity modifier such as carboxymethyl cellulose; an antifoggant such as potassium bromide; a development modifier such as poly-oxyalkylene compounds; a chelating agent such as ethylene-diamine tetraacetic acid; a silver halide solvent such as thiosulfates including sodium thiosulfate, potassium thio-sulfate, etc., 2-mercaptobenzoic acid and its derivatives, cyclic imides including uracil, alkanolamine, diamine, mesoionic compounds, thioethers and the like. A pH of the developing solution is generally about 11 to 14, preferably about 12 to 13.5.

It is preferred to further contain a compound (oleophilic agent) to make the silver image portion oleophilic. As the oleophilic agent, compounds as disclosed on pages 105 and 106 of André Rott and Edith Weyde, "Photographic Silver Halide Diffusion Processes", published by the Focal Press, London and New York (1972) may be mentioned. For example, a compound having a mercapto group or a thoine group, a quaternary ammonium compound and the like may be mentioned, and a compound having a mercapto group or a thoine group is preferably used in the present invention. A particularly preferred compound is a nitrogen-containing heterocyclic ring compound having a mercapto group or a thione group, which is disclosed in Japanese Patent Publication No. 29723/1973 and Japanese Provisional Patent Publication No. 12928/1983.

In the developing system of the present invention, a coating development is preferred as mentioned above and coating apparatuses of a developing solution as disclosed in, for example, Japanese Provisional Patent Publications No. 76603/1973, No. 289343/1993, No. 27680/1994, No. 27682/1994, No. 62952/1998 and No. 62951/1998 are preferably used. In the present invention, the coating development is more preferred but it is not limited only to the coating development and it may be a dipping development in the prior art.

In the aluminum lithographic printing plate, gelatin and the silver halide emulsion layer are not substantially cured so that an absorbed amount of the developing solution becomes relatively large. For making an amount of the waste developing solution substantially zero and for peeling the hydrophilic colloid layer such as the silver halide emulsion layer efficiently within a short period of time, it is preferred that an amount of the developing solution is about 50 ml or less, particularly preferably about 10 ml to about 40 ml per 1 g of the hydrophilic colloid of the lithographic printing plate with which the peeling means is bringing into close contact.

The developing solution existing on the surface of the lithographic printing plate may be squeezed by a squeezing means (e.g., squeegee rolls) before the peeling step depending on the constitution of the lithographic printing plate, the composition of the developing solution or the like.

A temperature of the developing solution is preferably within the range of about 15° C. to about 40° C., and a developing time may vary in the range of about 5 seconds to about 40 seconds. These conditions may be optionally determined depending on the constitution of the aluminum lithographic printing plate, the composition of the developing solution or the like.

In the coating development system to be preferably used in the present invention, only a developing solution necessary for development is coated. Thus, an amount of aluminum oxide decreased by dissolving in the developing solution can be reduced, for example, it can be made 0.6 g or less, preferably 0.5 g or less per 1 $m^2$ of the lithographic printing plate whereby an aluminum lithographic printing plate excellent in printing endurance can be obtained.

At the time of completion of the development, the above-mentioned peeling means are applied onto the surface of the lithographic printing plate. In the method of making an aluminum lithographic printing plate, when a hydrophilic colloid such as gelatin, etc. is remained on the aluminum plate, ink receptive property and printing endurance are worsened so that the peeling step of removing the silver halide emulsion layer, etc. after development is an extremely important step for the printing properties of the aluminum lithographic printing plate.

The present inventors have earnestly studied about the above-mentioned peeling sheet, and as a result, they have found a surprising fact that a liquid absorbing rate within a short period of time and a liquid-absorption capacity within a short period of time are extremely important. In the present specification, a liquid-absorption amount of the peeling means designates a liquid-absorption amount of a liquid retained in the hydrophilic colloid layer to be peeled off and at the upper surface thereof, and in the aluminum lithographic printing plate, it means preferably a liquid-absorption amount of the developing solution. It may be a mixed solution of the developing solution and water or an acidic aqueous solution which may be applied onto the surface of the lithographic printing plate to be added for the purpose of wetting or neutralization after the development (before peeling).

The peeling means of the present invention comprise a material having a rapid liquid-absorbing rate in which a liquid-absorption amount within 0.1 second after bringing into contact with a liquid is 60% or more based on a liquid-absorption amount within 0.2 second after the same, preferably 70% to 100%. Moreover, the peeling means of the present invention is a material having, in addition to the above-mentioned liquid-absorbing rate, a liquid-absorption amount or capacity 0.1 second after bringing into contact with a liquid is 10 ml or more, preferably 15 ml or more, particularly preferably 20 ml or more (the upper limit is not specifically mentioned but preferably up to 80 ml) per 1 $m^2$ of the peeling means. The liquid-absorption capacity also depends on an amount of the liquid retained by the hydrophilic colloid layer. Thus, it can be said that it is particularly preferred characteristics in making an aluminum lithographic printing plate to which about 20 ml or more of a developing solution per 1 $m^2$ of the lithographic printing plate is coated. The liquid-absorption amount of the present invention can be measured by, for example, a measurement device by the Bristow method (e.g., a dynamic scanning liquid-absorption meter). The Bristow method has been generally known as a method of measuring an absorption amount of a liquid within an extremely short period of time after bringing into contact with the liquid in the field of an ink-jet recording material and is described in, for example, Japanese Provisional Patent Publication No. 235865/1999.

The peeling means of the present invention are not specifically limited so long as it has the above-mentioned characteristics, and particularly preferred example is a material having a void layer in which fine particles are dispersed by a binder. As the fine particles, inorganic and organic fine particles can be used, and there may be mentioned, for example, inorganic fine particles such as light (synthetic) calcium carbonate, heavy (natural) calcium carbonate, kaolin, talc, calcium sulfate, barium sulfate, titanium dioxide, zinc oxide, zinc sulfide, zinc carbonate, satin white, aluminum silicate, diatomaceous earth, calcium silicate, magnesium silicate, synthetic amorphous silica, colloidal silica, colloidal alumina, pseudo boehmite, aluminum hydroxide, alumina, lithopone, zeolite, hydrated halosite, magnesium carbonate, magnesium hydroxide, etc.; and organic fine particles such as polystyrene, polymethyl methacrylate, etc.

An average particle size of the fine particles is generally a primary particle size of 10 $\mu$m or less, and the lower limit thereof may be a primary particle size of several nm.

A coated amount of the fine particles is preferably 3 g or more, particularly preferable 5 g or more per 1 $m^2$ of the peeling means, and the upper limit is up to about 30 g.

As a binder for dispersing the fine particles, conventionally known various kinds of hydrophilic binders may be used. There may be mentioned, for example, gelatin and its derivatives, polyvinyl pyrrolidone, pullulan, polyvinyl alcohol and its derivatives, polyethylene glycol, carboxymethyl cellulose, hydroxyethyl cellulose, dextran, dextrin, polyacrylic acid and its salts, agar, carrageenan, xanthan gum, locust bean gum, alginic acid, gum arabic, polyalkylene oxide type copolymerized polymer, water-soluble polyvinyl butyral, homopolymer or copolymer of vinyl monomer having sulfonic acid group, etc.

The above-mentioned binder is preferably used in a smaller ratio to the amount of the fine particles since a void layer having a rapid liquid-absorption rate can be obtained. The weight ratio of the fine particles and the binder is generally preferably in the range of 100:90 to 100:0.5, more preferably in the range of 100:70 to 100:5.

It is preferred to use a crosslinking agent (a hardener) in combination with the above-mentioned binder. As specific examples of the crosslinking agents, there may be mentioned aldehyde series compounds such as formaldehyde, glutaraldehyde, etc.; ketone compounds such as diacetyl, chloropehtanedione, etc.; 2-hydroxy-4,6-dichloro-1,3,5-triazine; compounds having a reactive halogen as disclosed in U.S. Pat. No. 3,288,775; divinyl sulfone; compounds having a reactive olefin as disclosed in U.S. Pat. No. 3,635,718; N-methylol compounds as disclosed in U.S. Pat. No. 2,732,316; isocyanates as disclosed in U.S. Pat. No. 3,103,437; aziridine compounds as disclosed in U.S. Pat. No. 3,017,280 and No. 2,983,611; carbodiimide series compounds as disclosed in U.S. Pat. No. 3,100,704; epoxy compounds as disclosed in U.S. Pat. No. 3,091,537; halogen carboxyaldehydes such as mucochloric acid; dioxane derivatives such as dihydroxydioxane; inorganic crosslinking agents such as chromium alum, zirconium sulfate, boric acid and borates, and the like, and these compounds may be used alone or in combination of two or more.

For coating a void layer comprising the fine particles, it is preferred to add at least one of a surfactant such as anionic, cationic, nonionic or betaine series surfactant to a coating solution for preparing the void layer.

The void layer may be single layer or two or more layers. Also, a non-void polymer layer may be provided under the void layer.

As a substrate for the peeling sheet, it may be either a transparent or opaque substrate. There may be mentioned, for example, non-coated papers such as ground wood free paper, ground wood paper, medium quality paper, super calender-treated paper, one-sided enamel paper, tracing paper, etc.; coated papers such as art paper, coated paper, light coated paper, fine coated paper, cast coated paper, etc.; a paper coated by a resin such as polyethylene, etc.; non-woven fabric, woven fabric, polyester resin, polycarbonate resin, cellulose acetate resin, acrylic resin, cellophane, aluminum foil, and a composite substrate of at least two of the above-mentioned materials.

A thickness of the substrate is not limited and generally in the range of 10 to 500 microns, preferably 30 to 300 microns.

The peeling sheet may be a sheet state material having substantially the same size as the lithographic printing plate, but for effecting a continuous processing in a plate-making apparatus, it is preferably used a continuous length roll-state material as shown in FIG. 1. The peeling sheet having a continuous length roll state preferably take a roll to roll shape. That is, the peeling sheet (2) in a continuous length roll state is fed from a master roll (5), brought into close contact with a lithographic printing plate at nip rollers (3), and after peeling a silver halide emulsion layer, etc., wound in a roll state (6).

In the present invention, a time from applying a peeling means to the silver halide emulsion layer to peeling off the same is not particularly limited, but if a contacting time is too long as ten or more seconds to several tens seconds, a coating layer of the peeling sheet is undesirably peeled off. Thus, the contacting time is preferably within about 5 seconds, more preferably within 3 seconds in the case of the above-mentioned continuous length roll state.

A neutralization and stabilization processing to stop progress of development or other processing may be carried out in the present invention before or after the peeling step. The above-mentioned oleophilic agent may be contained in the neutralization solution. When the neutralization solution is used, it is desirable to apply a necessary amount thereof by using a coating apparatus so that a waste solution shall be restrained as little as possible.

A processing with a finishing solution is applied to the silver image portion and the non-image portion exposed to the aluminum lithographic printing plate to heighten the respective oleophilicity and hydrophilicity and to protect the surface of the plate. In the present invention, it is preferred to apply the finishing solution by using a coating apparatus. In the finishing solution, it is preferred to add protective colloids such as gum arabic, dextrin, sodium alginate, propylene glycol ester of alginic acid, hydroxyethyl starch, carboxymethyl cellulose, hydroxyethyl cellulose, polyvinyl pyrrolidone, polystyrene sulfonic acid, polyvinyl alcohol, etc., to protect and to improve hydrophilicity of the anodized layer at the non-image portion. Also, it is preferred to add the above-mentioned oleophilic agents or enzymes to more improve oleophilicity at the image portion.

The peeling means of the present invention is not limited only to the aluminum lithographic printing plate but can be applied to the case where a silver halide emulsion layer of a lithographic printing plate described, for example, in Japanese Provisional Patent Publication No. 25739/1981, etc.

Another embodiment of the present invention is to apply to a sensitive material having a non-silver light-sensitive layer (a light-sensitive layer comprising a light-sensitive composition containing no silver salt). The present invention can be preferably applied to a lithographic printing plate comprising a light-sensitive composition.

The above-mentioned light-sensitive material is a material having a light-sensitive layer which causes change in solubility to an alkaline solution at an exposed portion or a non-exposed portion by exposure, and the above-mentioned conventionally known light-sensitive materials are included. Accordingly, as a binder thereof, it is preferred to have a solubility in an aqueous alkaline solution. More specifically, a polymer containing a carboxyl group-containing monomer as a copolymerizable component is preferred. A ratio of the carboxyl group-containing monomer in the copolymerizable components is preferably 3% by weight to 99% by weight. If the amount is less than the above range, a resulting copolymer may not be dissolved in an aqueous alkaline solution in some cases.

As the above-mentioned carboxyl group-containing monomer, there may be mentioned, for example, acrylic acid, methacrylic acid, 2-carboxyethyl acrylate, 2-carboxyethyl methacrylate, chrotonic acid, maleic acid, fumaric acid, monoalkyl maleate, monoalkyl fumarate, 4-carboxystyrene, etc.

It is also preferred to synthesize and use a multi-dimensional copolymer by incorporating other monomer component than the carboxyl group-containing monomer in the copolymer. Such a monomer which can be incorporated into the copolymer may include styrene derivatives such as styrene, 4-methylstyrene, 4-hydroxystyrene, 4-acetoxystyrene, 4-carboxystyrene, 4-aminostyrene, chloromethylstyrene, 4-methoxystyrene, etc.; alkyl methacrylates such as methyl methacrylate, ethyl methacrylate, butyl methacrylate, hexyl methacrylate, 2-ethylhexyl methacrylate, cyclohexyl methacrylate, dodecyl methacrylate, etc.; aryl methacrylates or alkylaryl methacrylates such as phenyl methacrylate, benzyl methacrylate, etc.; methacrylates having an alkyleneoxy group such as 2-hydroxyethyl methacrylate, 2-hydroxypropyl methacrylate, methoxydiethylene glycol methacrylate, methoxypolyethylene glycol methacrylate, polypropyleneglycol methacrylate, etc.; methacrylates containing an amino group such as 2-dimethyl-aminoethyl methacrylate, 2-diethylaminoethyl methacrylate, etc.; acrylates corresponding to the above-mentioned methacrylates; monomers having a phosphoric acid group such as vinyl phosphonic acid, etc.; amino group-containing monomers such as allylamine, diallylamine, etc.; vinyl sulfonic acid and a salt thereof; allylsulfonic acid and a salt thereof; methallylsulfonic acid and a salt thereof; styrenesulfonic acid and a salt thereof; monomers having a sulfonic acid group such as 2-acrylamido-2-methylpropane sulfonic acid and a salt thereof; monomers having a nitrogen-containing heterocyclic ring such as 4-vinylpyridine, 2-vinylpyridine, N-vinylimidazole, N-vinylcarbazole, etc.; monomers having a quaternary ammonium salt group such as 4-vinylbenzyltrimethylammonium chloride, acryloyloxyethyltrimethylammonium chloride, methacryloyloxyethyltrimethylammonium chloride, a quaternary product of dimethylaminopropylacrylamide by methyl chloride, a quaternary product of N-vinylimidazole by methyl chloride, 4-vinylbenzylpyridinium chloride, etc.; acrylo-nitrile, methacrylonitrile; acrylamide or methacrylamide derivatives such as acrylamide, methacrylamide, dimethyl-acrylamide, diethylacrylamide, N-isopropylacrylamide, diacetoneacrylamide, N-methylolacrylamide, N-methoxyethyl-acrylamide, 4-hydroxyphenylacrylamide, etc.; phenylmaleimide, hydroxyphenylmaleimide; vinyl esters such as vinyl acetate, viyl chloroacetate, vinyl propionate, vinyl butyrate, vinyl stearate, vinyl benzoate, etc.; vinyl ethers such as methyl vinyl ether, butyl vinyl ether, etc.; and other various kinds of monomers such as N-vinylpyrrolidone, acryloylmorpholine, tetrahydrofurfuryl methacrylate, vinyl chloride, vinylidene chloride, allyl alcohol, vinyl trimethoxysilane, glycidyl methacrylate, and the like. A ratio of these monomers in the copolymer may be optionally elected so long as the ratio of the carboxyl group-containing monomer in the above-mentioned copolymer is maintained.

With regard to the molecular weight of the polymer as mentioned above, it is preferably within the range of about 1,000 to about 1,000,000, more preferably within the range of about 10,000 to about 200,000 in terms of a weight average molecular weight.

One example of the light-sensitive material to be used in the present invention is of the type wherein crosslinking occurs due to decomposition of a photopolymerization initiator which forms a radical and alkali resistance, solvent resistance and the like at the crosslinked portion which becomes an image-forming portion are improved since the crosslinked portion is not hydrolyzed by the action of strong alkali or the like.

Examples of the photopolymerization initiator forming a radical may include any compounds which can generate a radical by photoirradiation, and may be preferably mentioned trihaloalkyl-substituted nitrogen-containing heterocyclic compounds such as s-triazine compounds and oxadiazole derivatives; trihaloalkylsulfonyl compounds; cationic dyes containing a borate complex as a pair anion; a combination of a cationic dye and a quaternary salt compound containing a borate complex; hexaarylbiimidazole; titanocene compounds; ketoxime compounds; thio compounds; organic peroxides and the like. As an example of the photopolymerization initiator, there is a photo-radical generating agent. When the trihaloalkyl-substituted nitrogen-containing heterocyclic compounds or the trihaloalkylsulfonyl compounds as mentioned above are used as the photoradical generating agent, they may be used alone if they have an absorption wavelength between the wavelengths of an exposure light source. When the absorbing wavelength region of the triazine compound is out of the wavelength region of the exposure light source, a dye to absorb light with a wavelength region of the light source is preferably added. Such a dye may be mentioned various dyes including methyne, polymethyne, triarylmethane, indoline, azine, thiazine, xanthene, oxazine, acridine, cyanine, carbocyanine, hemicyanine, rhodamine, azamethyne, etc.

In addition to the above-mentioned respective components, other components may be preferably added to the light-sensitive composition for various kinds of purposes. Various kinds of polymerization inhibitors may be particularly preferably added for the purpose of preventing from thermal polymerization or thermal crosslinking and improving preservability of the composition for a long period of time. As the polymerization inhibitors to be used in this case, there may be preferably used compounds having various kinds of phenolic hydroxyl group such as hydroquinones, catechols, naphthols, cresols, etc.; and quinone type compounds, and particularly preferably hydroquinone. An amount of the polymerization inhibitor to be added is preferably within the range of 0.1 part by weight to 10 parts by weight based on 100 parts by weight of the polymer component.

As the light-sensitive material utilizing a radical polymerization using a photopolymerization initiator (or photoradical generator), a system including a (polyfunctional) acrylate monomer has been conventionally known. As the acrylate monomer to be used in such a case, there may be mentioned, for example, mono-functional acrylic monomers such as butyl acrylate, isobutyl acrylate, lauryl acrylate, cetyl acrylate, stearyl acrylate, cyclohexyl acrylate, isonorbornyl acrylate, benzyl acrylate, 2-phenoxyethyl acrylate, tetrahydrofurfuryl acrylate, 2-hydroxyethyl acrylate, 2-methoxyethyl acrylate, etc.; poly-functional acrylic monomers such as 1,4-butanediol diacrylate, 1,6-hexanediol diacrylate, neopentylglycol diacrylate, tetraethyleneglycol diacrylate, trisacryloyl-oxyethyl isocyanurate, tripropyleneglycol diacrylate, ethyleneglycol glycerol triacrylate, glycerolepoxy triacrylate, trimethylolpropane triacrylate, pentaerythritol triacrylate, pentaerythritol tetraacrylate, etc.; and the like.

As the elements which constitute the light-sensitive composition, other elements may be added thereto for the various purposes in addition to the above-mentioned elements. It is preferably carried out to add various kinds of dye or pigments to the composition for increasing acknowledging properties with eyes of an image, or to add various kinds of inorganic or organic fine particles to prevent from blocking of the light-sensitive composition. Moreover, to protect the light-sensitive layer, other layer(s) may be provided adjacent to the light-sensitive layer.

A thickness of the light-sensitive layer itself formed on a support and to be used as a lithographic printing plate is preferably within the range of about 0.5 micron to about 10 microns, particularly preferably within the range of about 1 micron to about 5 microns in a dry film thickness to markedly improve printing endurance. The light-sensitive layer can be formed by preparing a solution mixing various components as mentioned above, coating on the support by using conventionally known various coating systems and drying. As the support, for example, a film or a polyethylene-coated paper may be used. Preferred support is a grained and anodized aluminum plate.

For using a material having the light-sensitive layer formed on the support as mentioned above as a printing plate, adhesion exposure or laser beam scanning exposure is carried out. Then, a solubility at the exposed portion in an alkaline developing solution decreases due to crosslinking at the exposed portion so that the unexposed portion is dissolved by the alkaline developing solution whereby a pattern is formed.

As the alkaline developing solution, it is not particularly limited so long as it is a solution capable of dissolving the polymer or the binder resin according to the present invention. Particularly preferred is an aqueous solution in which at least one of alkaline compounds such as sodium hydroxide, potassium hydroxide, sodium silicate, potassium silicate, sodium metasilicate, potassium metasilicate, monoethanolamine, diethanolamine, triethanolamine, triethylammonium hydroxide, etc. is dissolved since such a solution can selectively dissolve the unexposed portion with good state and expose the surface of the support under the unexposed portion. Also, various kinds of alcohols such as ethanol, propanol, isopropanol, ethylene glycol, diethylene glycol, triethylene glycol, glycerin, benzyl alcohol, etc., are preferably added to the alkaline developing solution singly or in combination of two or more. After subjecting to developing treatment by using such an alkaline developing solution, usual gum coating is preferably carried out thereon by using gum Arabic, etc.

In the present invention, a timing of applying the peeling means to the light-sensitive material is the time at which the light-sensitive layer at the exposed or non-exposed portion of the light-sensitive material becomes to be removable by the peeling means after the light-sensitive layer is partially dissolved (or swelled) or completely dissolved by the alkaline developing solution. From the above-mentioned point of view, it is preferred to employ the coating development system in which a necessary amount of the developing solution is coated on the upper surface of the light-sensitive material and maintained thereon. The amount of the developing solution to be coated is preferably about 20 to about 100 ml, more preferably 30 to 80 ml per 1 $m^2$ of the light-sensitive material.

In the present invention, the time from applying the peeling means to peeling off the light-sensitive layer is not limited. If the contacting time is too long as several ten seconds, the coating layer of the peeling sheet is undesirably peeled off. Thus, in the case of the continuous length roll state as mentioned above, it is preferably peeled off with the contacting time of within 5 seconds, particularly preferably within 3 seconds.

EXAMPLES

In the following, the present invention is explained by referring to Examples.

Example 1

According to the method as disclosed in U.S. Pat. No. 5,427,889 which is incorporated as a reference herein, electrolytic roughening treatment and anodization of an aluminum support were carried out to obtain an aluminum support having a thickness of 0.30 mm to which pits with a diameter of 0.03 to 0.30 $\mu$m had been formed with about 5,600 per 100 $\mu m^2$ on a plateau with an average diameter of about 5 $\mu$m, and the pit has an average diameter of 0.08 $\mu$m. This aluminum support was subjected to anodization after the surface roughening treatment, and had an amount of aluminum oxide of 2.5 $g/m^2$ and an average roughness (Ra) measured by JIS B 0601 (1994) of 0.5 $\mu$l to 0.6 $\mu$m.

On the aluminum support, a palladium sulfide nuclear was coated and then dried. An amount of nucleus contained in a physical development nuclei layer was 3 $mg/m^2$.

As a hydrophilic colloid, alkali-treated gelatin was used. As a silver halide emulsion, a silver chloroiodobromide emulsion containing 15 mol % of silver bromide and 0.4 mol % of silver iodide, and having an average particle size of 0.2 $\mu$m, with which 0.006 mmol of potassium hexachloroiridate (IV) per mole of silver was doped, was prepared by the control double jet method. Thereafter, the emulsion was subjected to flocculation and washed. Moreover, after sulfurgold sensitization was applied to the emulsion, a stabilizer was added thereto, and then, spectrally sensitized by using 3 mg of a red-sensitive sensitizing dye per 1 g of silver.

A surfactant was added to the thus prepared silver halide emulsion to prepare a coating solution. This coating solution for an emulsion layer was coated on the aluminum support on which the above-mentioned physical development nuclei had been coated, so that an amount of silver became 2.2 $g/m^2$ (which is 3.46 g in terms of silver nitrate) and a gelatin amount of 2.2 $g/m^2$, followed by drying to obtain a lithographic printing material.

On the thus prepared lithographic printing material (A2 size), an image was outputted by an output machine having a red LD laser at 633 nm as a light source. Then, the lithographic printing material was processed by a processor for plate making shown in FIG. 1 to obtain a lithographic printing plate.

Compositions of a developing solution, a neutralizing solution and a finishing solution used in the processing are shown below.

| <Developing solution> | |
|---|---|
| Sodium hydroxide | 25 g |
| Copolymer of polystyrenesulfonic acid and maleic anhydride (Average molecular weight Mw: 500,000) | 10 g |
| Ethylenediaminetetraacetic acid sodium salt | 2 g |
| Anhydrous sodium sulfite | 100 g |
| Monomethylethanolamine | 50 g |
| 2-Mercapto-5-n-heptyl-oxadiazole | 0.5 g |
| Sodium thiosulfate (pentahydrate) | 8 g |
| Hydroquinone | 15 g |
| 1-Phenyl-3-pyrazolidinone | 3 g |
| Make up to 1,000 ml with addition of deionized water. A pH (25° C.) = 13.1. | |
| <Neutralizing solution> | |
| 2-Mercapto-5-n-heptyl-oxadiazole | 0.5 g |
| Monoethanolamine | 13 g |
| Sodium bisulfite | 10 g |
| Potassium primary phosphate | 40 g |
| Make up to 1,000 ml with addition of deionized water. A pH = 6.0. | |
| <Finishing solution> | |
| Phosphoric acid | 0.5 g |
| Monoethanolamine | 5.0 g |
| 2-Mercapto-5-n-heptyl-oxadiazole | 0.5 g |
| Polyglycerose (hexamer) | 50 g |
| Make up to 1,000 ml with addition of deionized water. A pH = 7.2. | |

The developing solution was coated by using the coating apparatus (1) shown in FIG. 1 so that the amount thereof became 30 ml per 1 g of gelatin of the lithographic printing material (P). The temperature of the developing solution was 25° C.

Fifteen seconds after coating the developing solution, a master roll (5) of a peeling sheet was moved so that a roll state-peeling sheet (2) was brought into close contact with the surface of the lithographic printing plate by nip rolls (3) and a silver halide emulsion layer was peeled off. Thereafter, the peeling sheet (2) was rolled in a roll state (6). Squeegee rolls (4) were not used. The peeling sheet was a roll state-peeling sheet having a fine particle layer prepared by coating an aqueous dispersion in which 100 parts by weight of silica and 30 parts by weight of gelatin were dispersed in water on a polyethylene resin coated paper. In spite of instantaneous contacting time (about 1 second or shorter), the entire silver halide emulsion layer was transferred to the coating layer of the roll state-peeling sheet. Waste liquor of the developing solution was substantially not generated.

Subsequently, the neutralizing solution and the finishing solution were successively coated by using the same apparatus as used in the development procedure. Drying apparatuses (not shown in the figure) were provided between the neutralizing solution-coating apparatus (now shown in the figure) and the finishing solution-coating apparatus (now shown in the figure), and after the finishing solution-coating apparatus so that the neutralizing solution and the finishing solution were dried. Coating amounts of the neutralizing solution and the finishing solution were made each 20 ml per 1 $m^2$ of the lithographic printing plate.

Thus, plate-making procedures could be carried out without substantially generating waste liquors between the development procedure and the finishing procedure. With respect to the lithographic printing plate thus prepared, printing was carried out by using a printer Heidelberg TOK (trade name, an offset printing press manufactured by Heidelberg Co.), ink (New Champion Black H, trade name, produced by Dainippon Ink Co., Japan) and commercially available dampening solution for a PS plate. As a result, it was a lithographic printing plate excellent in ink-receptive properties and having a high printing endurance of 100,000 sheets or more.

Example 2

The developing solution prepared in the same manner as in Example 1 was coated onto a lithographic printing material in an amount of 40 ml per 1 g of gelatin, and 15 seconds later, a master roll (5) of a peeling sheet was moved so that a roll state-peeling sheet (2) was brought into close contact with the surface of the lithographic printing plate by nip rolls (3) and a silver halide emulsion layer was peeled off. The entire silver halide emulsion layer was transferred to the coating layer of the roll state-peeling sheet. Waste liquor of the developing solution was substantially not generated.

Thereafter, process for preparing a lithographic printing plate was carried out in the same manner as in Example 1 and printing was carried out. Similarly as in Example 1, it was a lithographic printing plate excellent in ink-receptive properties and having a high printing endurance of 100,000 sheets or more.

Example 3

The developing solution prepared in the same manner as in Example 1 was coated onto a lithographic printing material in an amount of 70 ml per 1 g of gelatin, and 12 seconds later, about 40% of the coated developing solution was removed by squeegee rolls (4), and the silver halide emulsion layer was similarly removed after 15 seconds. Thereafter, process for preparing a lithographic printing plate was carried out in the same manner as in Example 1 and printing was carried out. It was a lithographic printing plate excellent in ink-receptive properties and having a high printing endurance of 100,000 sheets or more.

Example 4

In the same manner as in Example 1, physical development nuclei layer was coated on an aluminum support and dried.

In the same manner as in Example 1, a silver halide emulsion was prepared.

A surfactant was added to the thus prepared silver halide emulsion to prepare a coating solution. This coating solution for an emulsion layer was coated on the aluminum support on which the above-mentioned physical development nuclei had been coated, so that an amount of silver became 2 g/m$^2$ (which is 3.15 g in terms of silver nitrate) and a gelatin amount of 2 g/m$^2$, followed by drying to obtain a lithographic printing material.

On the thus prepared lithographic printing material (A2 size), an image was outputted by an output machine having a red LD laser at 633 nm as a light source. Then, the lithographic printing material was processed by a processor for plate making shown in FIG. 1 to obtain a lithographic printing plate.

The developing solution, the neutralizing solution and the finishing solution used were the same as those of Example 1.

The developing solution was coated by using the coating apparatus (1) shown in FIG. 1 so that the amount thereof became 70 ml per 1 m$^2$ of the lithographic printing material (P). The temperature of the developing solution was 23° C. Fifteen seconds after coating the developing solution, a master roll (5) of a peeling sheet was moved so that a roll state-peeling sheet (2) was brought into close contact with the plate surface by nip rolls (3) and a silver halide emulsion layer was peeled off. Thereafter, the peeling sheet (2) was rolled in a roll state (6). Squeegee rolls (4) were not used. The following materials were used for preparing the peeling sheet.

Peeling sheet A: A material having a void layer prepared by coating on a polyethylene resin coated paper an aqueous dispersion in which 100 parts by weight of dry-method silica having an average grain size of 8 nm and 40 parts by weight of polyvinyl alcohol were dispersed in water with a polyvinyl alcohol amount of 6 g/m$^2$.

Peeling sheet B: A material comprising an aqueous solution containing gelatin and polyvinyl pyrrolidone with a weight ratio of 1:1 being coated on a polyethylene resin coated paper in an amount of a polymer solid component of 6 g/m$^2$.

Peeling sheet C: A material in which a gelatin layer containing 5% by weight of silica particles having an average particle size of 5 μm based on the amount of gelatin is coated on a polyethylene resin-coated paper in a gelatin amount of 3 g/ml and cured.

In the measurement of using a dynamic scanning liquid-absorption meter (available from Kyowa Seiko K. K., trade name: KM350D), the peeling sheet A had liquid-absorption characteristics that a liquid-absorption amount within 0.1 second after getting in contact with the above-mentioned developing solution was 36 ml/m$^2$, and a liquid-absorption amount within 0.2 second after the same was 43 ml/m$^2$. The peeling sheet B had liquid-absorption characteristics that a liquid-absorption amount within 0.1 second after getting in contact with the above-mentioned developing solution was 6 ml/m$^2$, and a liquid-absorption amount within 0.2 second after the same was 13 ml/m$^2$. The peeling sheet C had liquid-absorption characteristics that a liquid-absorption amount within 0.1 second after getting in contact with the above-mentioned developing solution was 4 ml/m$^2$, and a liquid-absorption amount within 0.2 second after the same was 9 ml/m$^2$.

In spite of instantaneous contacting time (about 0.1 to about 0.3 second which may vary depending on the conveying speed of the plate), the entire silver halide emulsion layer was transferred to the coating layer of the roll state-peeling sheet A. Waste liquor of the developing solution was substantially not generated. To the contrary, in the peeling sheets B and C, no peeling of the emulsion layer could be done.

The lithographic printing plate peeled off by using the peeling sheet A was then successively coated thereon the neutralizing solution and the finishing solution by using the same coating apparatuses as that of the developing solution-coating apparatus. Drying apparatuses (not shown in the figure) were provided between the neutralizing solution-coating apparatus (now shown in the figure) and the finishing solution-coating apparatus (now shown in the figure), and after the finishing solution-coating apparatus so that the neutralizing solution and the finishing solution were dried. Coating amounts of the neutralizing solution and the finishing solution were made each 20 ml per 1 m$^2$ of the lithographic printing plate.

Thus, plate-making procedures could be carried out without substantially generating waste liquors between the development procedure and the finishing procedure. With respect to the lithographic printing plate prepared by using the peeling sheet A, printing was carried out by using a printer Heidelberg TOK (trade name, an offset printing press manufactured by Heidelberg Co.), ink (New Champion Black H, trade name, produced by Dainippon Ink Co., Japan) and commercially available dampening solution for a PS plate. As a result, it was a lithographic printing plate excellent in ink-receptive properties and having a high printing endurance of 100,000 sheets or more.

Example 5

Experiment was carried out in the same manner as in Example 4 except for using the peeling sheet as mentioned below.

Peeling sheet D: A material having a void layer prepared by coating an aqueous dispersion in which 100 parts by weight of dry-method silica having an average grain size of 7 nm and 30 parts by weight of polyvinyl alcohol were dispersed in water on a paper surface side of a substrate in which a polyethylene resin had been coated on one side of paper with a polyvinyl alcohol amount of 6 g/m$^2$.

Peeling sheet E: A material having a void layer prepared by coating a coating solution comprising 100 parts by weight of alumina sol and 5 parts by weight of polyvinyl alcohol with a solid component of 10 g/m$^2$ on a synthetic paper substrate with a basis weight of 60 g/m$^2$.

In the measurement of using a dynamic scanning liquid-absorption meter, the peeling sheet D had liquid-absorption characteristics that a liquid-absorption amount within 0.1 second after getting in contact with the above-mentioned developing solution was 44 ml/m$^2$, and a liquid-absorption amount within 0.2 second after the same was 53 ml/m. The peeling sheet E had liquid-absorption characteristics that a liquid-absorption amount within 0.1 second after getting in contact with the above-mentioned developing solution was 19 ml/m$^2$, and a liquid-absorption amount within 0.2 second after the same was 27 ml/m.

In either of the peeling sheets D and E, peeling characteristics of the emulsion layer and printing characteristics are both excellent as in the peeling sheet A. Also, no waste liquor of the developing solution was generated in both cases.

Example 6

In the same manner as in Example 4, peeling sheets F to H having the following liquid-absorption characteristics were prepared except for changing the coated (amount of the silica layer in the peeling sheet A. In the peeling sheet F, liquid-absorption amounts (ml) 0.1 second/0.2 second after contacting with the developing solution per 1 m$^2$ were 22 ml/28 ml, respectively. Similarly, they were 13 ml/18 ml in the peeling sheet G, and 7 mill 1 ml in the peeling sheet H, respectively.

Lithographic printing materials were prepared and printing was carried out in accordance with Example 4. As a result, the peeling sheets F and G showed excellent peeling characteristics and printing characteristics as in the peeling sheet A, but in the peeling sheet H, peeling was slightly bad results. However, when the squeegee rolls (4) were moved and a small amount of the developing solution at the plate surface was squeezed to prepare a lithographic printing plate, good results in both of peeling characteristics and printing characteristics can be obtained even when the peeling sheet H had been used.

Example 7

According to the method as disclosed in U.S. Pat. No. 5,427,889 which is incorporated as a reference herein, electrolytic roughening treatment and anodization of an aluminum support were carried out to obtain an aluminum support having a thickness of 0.30 mm to which pits with a diameter of 0.03 to 0.30 μm had been formed with about 2,700 per 100 m$^2$ on a plateau with an average diameter of about 5 μm, and the pit has an average diameter of 0.13 μm. This aluminum support was subjected to anodization after the surface roughening treatment, and had an amount of aluminum oxide of 2.0 g/m$^2$ and an average roughness (Ra) measured by JIS B 0601 (1994) of 0.4 μm to 0.5 μm.

On the aluminum support, a palladium sulfide nuclear was coated and then dried. An amount of nucleus contained in a physical development nuclei layer was 3 mg/m$^2$.

As a hydrophilic colloid, alkali-treated gelatin was used. As a silver halide emulsion, a silver chlorobromide emulsion containing 1.5 mol % of silver bromide, and having an average particle size of 0.3 μm, with which 0.006 mmol of potassium hexachloroiridate (Iv) per mole of silver was doped, was prepared by the control double jet method. Then, the emulsion was converted with KI corresponding to 0.3 mol % of silver iodide after completion of physical ripening to prepare a silver chloroiodobromide emulsion. Thereafter, the emulsion was subjected to flocculation and washed. Moreover, after gelatin was added to the emulsion and sulfur-gold sensitization was applied to the emulsion, a stabilizer was added thereto, and then, spectrally sensitized by using 3 mg of a red-sensitive sensitizing dye per 1 g of silver.

A surfactant was added to the thus prepared silver halide emulsion and a gelatin amount was adjusted to prepare a coating solution for forming a silver halide emulsion layer having a ratio of a silver nitrate amount and a gelatin amount as shown below. These coating solutions were coated on the aluminum support on which the above-mentioned physical development nuclei had been coated, so that an amount of silver (a silver nitrate amount) became 2.5 g per 1 m$^2$, followed by drying to obtain lithographic printing material.

Sample 1: (Gelatin)/(Silver halide in terms of silver nitrate)=0.6

Sample 2: (Gelatin)/(Silver halide in terms of silver nitrate)=0.6

Sample 3: (Gelatin)/(Silver halide in terms of silver nitrate)=0.4

On the thus prepared lithographic printing materials (A2 size), an image was outputted by an output machine having a red LD laser at 633 nm as a light source. Then, the lithographic printing material was processed by a processor for plate making shown in FIG. 1 to obtain a lithographic printing plate.

The developing solution, the neutralizing solution and the finishing solution used were the same as those of Example 1.

The developing solution was coated by using the coating apparatus (1) shown in FIG. 1 so that the amount thereof was changed to 60 ml and 40 ml per 1 ml of the lithographic printing material (P). No temperature adjustment of the developing solution was carried out but the temperature at the time of development environment was 23° C. and a relative humidity was 63%. The plate surface temperature at the time of development was 21° C. Fifteen seconds after coating the developing solution, a master roll (5) of a peeling sheet was moved so that a roll state-peeling sheet (2) was brought into close contact with the plate surface by nip rolls (3) and a silver halide emulsion layer was peeled off. Thereafter, the peeling sheet (2) was rolled in a roll state (6). Squeegee rolls (4) were not used. A contacting time of the peeling sheet was about 0.2 second or so.

As the peeling sheet, a material having a void layer prepared by coating an aqueous dispersion in which 100 parts by weight of dry method silica having an average particle size of 7 nm and 40 parts by weight of polyvinyl alcohol were dispersed in water with a polyvinyl alcohol amount of 6 g/m² on usual wood free paper with a weighing amount of 70 g/m². This peeling sheet had liquid-absorption characteristics that a liquid-absorption amount within 0.1 second after getting in contact with the above-mentioned developing solution was 39 ml/m², and a liquid-absorption amount within 0.2 second after the same was 48 ml/m² in the measurement of using a dynamic scanning liquid-absorption meter.

The lithographic printing plate in which the silver halide emulsion layer had been peeled off by using the peeling sheet was then successively coated thereon the neutralizing solution and the finishing solution by using the same coating apparatuses as that of the developing solution-coating apparatus. Drying apparatuses (not shown in the figure) were provided between the neutralizing solution-coating apparatus (now shown in the figure) and the finishing solution-coating apparatus (now shown in the figure), and after the finishing solution-coating apparatus so that the neutralizing solution and the finishing solution were dried. Coating amounts of the neutralizing solution and the finishing solution were made each 20 ml per 1 m² of the lithographic printing plate.

Thus, plate-making procedures could be carried out without substantially generating waste liquors between the development procedure and the finishing procedure. With respect to the lithographic printing plate thus prepared, printing was carried out by using a printer Heidelberg TOK (trade name, an offset printing press manufactured by Heidelberg Co.), ink (New Champion Black H, trade name, produced by Dainippon Ink Co., Japan) and commercially available dampening solution for a PS plate. Evaluations of peeling state of the silver halide emulsion layer, ink receptive properties at printing and printing endurance were carried out. The results are shown in Table 1.

<Peeled State of the Silver Halide Emulsion Layer>

◯: No silver halide emulsion layer is visually remained and entirely peeled off.

X: Silver halide emulsion layer is not partially peeled off.

<Ink Receptive Property>

It was evaluated with a number of printed sheets till sufficient ink concentration could be obtained. Less number of sheets means excellent properties.

<Printing Endurance>

Printing endurance was evaluated by a number of printed sheets when printing could not be carried out due to deficiency of a silver image. Larger number of sheets means excellent properties.

TABLE 1

|  | Coated amount of Developing solution | Peeled state | Ink receptive property | Printing endurance |
|---|---|---|---|---|
| Sample 1 | 60 ml | ◯ | 30 sheets or less | 50,000 to 100,000 sheets |
|  | 40 ml | ◯ | Exceeding 30 sheets | 50,000 to 100,000 sheets |

TABLE 1-continued

|  | Coated amount of Developing solution | Peeled state | Ink receptive property | Printing endurance |
|---|---|---|---|---|
| Sample 2 | 60 ml | ◯ | 10 sheets or less | 100,000 sheets or more |
|  | 40 ml | ◯ | 30 sheets or less | 100,000 sheets or more |
| Sample 3 | 60 ml | ◯ | 10 sheets or less | 100,000 sheets or more |
|  | 40 ml | ◯ | 30 sheets or less | 100,000 sheets or more |

Example 8

In the same manner as in Example 7 except for further providing a gelatin protective layer in an amount of 0.5 g/m₂ to Samples 1 to 3 in Example 7, Samples 1a, 2a and 3a were prepared, respectively. Lithographic printing plates were prepared in the same manner as in Example 7 and evaluated in the same manner.

The results are shown in Table 2.

TABLE 2

|  | Coated amount of Developing solution | Peeled state | Ink receptive property | Printing endurance |
|---|---|---|---|---|
| Sample 1a | 60 ml | ◯ | 10 sheets or less | 100,000 sheets or more |
|  | 40 ml | ◯ | 10 sheets or less | 50,000 to 100,000 sheets |
| Sample 2a | 60 ml | ◯ | 10 sheets or less | 100,000 sheets or more |
|  | 40 ml | ◯ | 10 sheets or less | 100,000 sheets or more |
| Sample 3a | 60 ml | ◯ | 10 sheets or less | 100,000 sheets or more |
|  | 40 ml | ◯ | 10 sheets or less | 100,000 sheets or more |

Example 9

A lithographic printing plate comprising a light-sensitive composition containing no silver salt was prepared according to the method described in Japanese Provisional Patent Publication No. 212252/1999.

That is, the polymer of the formula (I) shown below was dissolved in a mixed solvent of methanol/dioxane (1/1, weight ratio) under heating to prepare a 10% by weight solution in an amount of 100 g. To the solution was added 60 g of a resol resin (Shownol CKS-3866, condensate of bisphenol A and formalin, average polymerization degree: 6, available from Showa Kobunshi K. K., Japan) as a methylol compound. Further, as an acid generator, 2 g of diphenyl iodonium trifluoromethanesulfonate (available from Tokyo Kasei K.K., Japan) was added to the mixture, and 0.1 g of the photosensitization dye represented by the formula (II) shown below was added to the same and dissolved therein. The resulting solution was coated on a roughened and anodized aluminum plate by using a doctor bar so that a coated amount in a dried state became 2.0 g/m², and dried in a drier at 70° C. for 10 minutes to prepare a lithographic printing plate material.

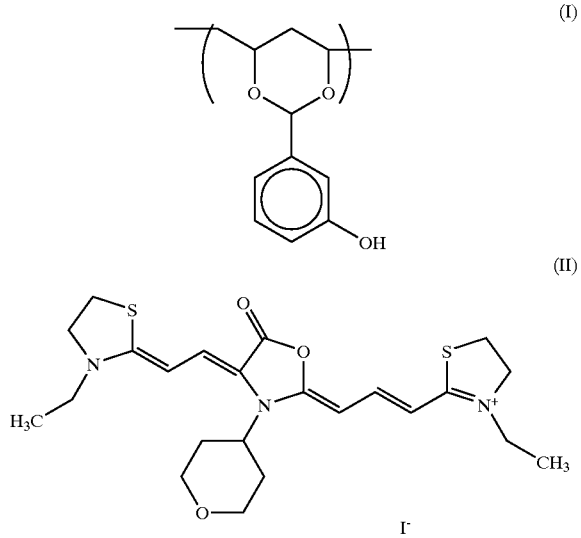

As an output machine, a semiconductor laser having an output wavelength of 830 nm and an output of 2 W was used. The above-mentioned lithographic printing plate was wound onto a drum and pulse exposure was carried out to print a resolution test pattern. The lithographic printing plate after exposure was subjected to heat treatment at 100° C. for 2 minutes.

The lithographic printing plate subjected to heat treatment was subjected to development treatment by using the apparatus shown in FIG. 1, and then, an uncured resin layer was peeled off by a peeling sheet. As a developing solution, 6% sodium metasilicate aqueous solution was used. The developing solution was so coated that an amount thereof became 70 ml per 12 m of the lithographic printing plate. The temperature of the developing solution was 23° C. Fifteen seconds after coating the developing solution, a master roll (5) of the peeling sheet was moved so that the roll state-peeling sheet (2) was brought into close contact with the plate surface by nip rolls (3) and a light-sensitive layer was peeled off. Thereafter, the peeling sheet (2) was rolled in a roll state (6). Before applying the peeling sheet to the plate, excessive developing solution was removed by squeegee rolls. As the peeling sheet, the peeling sheets A, B and C prepared in Example 4 were used.

In the peeling sheet A, in spite of an instantaneous contacting time (about 0.1 to about 0.3 second which may vary depending on the conveying speed of the plate), the entire light-sensitive layer was transferred to the peeling sheet and waste liquor of the developing solution was substantially not generated. To the contrary, in the peeling sheets B and C, no peeling of the light-sensitive layer could be done.

With respect to the lithographic printing plate prepared by using the peeling sheet A, printing was carried out by using a printer Heidelberg TOK (trade name, an offset printing press manufactured by Heidelberg Co.), ink (New Champion Black H, trade name, produced by Dainippon Ink Co., Japan) and commercially available dampening solution for a PS plate. As a result, it was a lithographic printing plate excellent in ink-receptive properties and having a high printing endurance of 100,000 sheets or more.

Example 10

After exposing a commercially available PS plate, a lithographic printing plate was prepared in the same manner as in Example 9. As a result, the same results as in Example 9 could be obtained.

What is claimed is:

1. A method of processing a light-sensitive material which comprises exposing a light-sensitive material having at least one light-sensitive layer on a support, and subjecting to development by a dipping system or a coating system, and then, peeling at least the light-sensitive layer off by bringing a peeling means into close contact for a contacting time within 3 seconds, with said light-sensitive material, wherein said peeling means is a material having a ratio (A)/(B) of a liquid-absorbing amount (A) at 0.1 second after contacting with a liquid, to a liquid absorbing amount (B) at 0.2 second after contacting with the liquid, the ratio (A)/(B) being 60% or more.

2. The method of processing a light-sensitive material according to claim 1, wherein said peeling means is a material having a liquid-absorption capacity of 10 ml or more within 0.1 second after getting in contact with a liquid per 1 m$^2$ of the peeling means.

3. The method of processing a light-sensitive material according to claim 1, wherein the peeling means is a material having a void layer in which fine particles are dispersed on a substrate.

4. The method of processing a light-sensitive material according to claim 3, wherein the peeling means is a material having a void layer in which fine particles are dispersed in an amount of 5 g/m$^2$ or more on a substrate.

5. The method of processing a light-sensitive material according to claim 3, wherein the peeling means is a material having a void layer in which fine particles are dispersed in a binder on a substrate.

6. The method of processing a light-sensitive material according to claim 5, wherein the peeling means is a material having a void layer in which a weight ratio of fine particles and a binder is 100:70 to 100:5.

7. The method of processing a light-sensitive material according to claim 1, wherein the light-sensitive material is a light-sensitive material having a non-silver light-sensitive material.

8. The method of processing a light-sensitive material according to claim 7, wherein the light-sensitive material is a lithographic printing plate having a non-silver light sensitive layer comprising a light-sensitive composition on an anodized support.

9. The method of processing a light-sensitive material according to claim 1, wherein the light-sensitive material is a lithographic printing plate having a silver halide emulsion layer as a light-sensitive layer on an anodized aluminum support.

10. The method of processing a light-sensitive material according to claim 9, wherein the development is a coating development in which a developing solution is coated onto the light-sensitive material to carry out the development.

11. The method of processing a light-sensitive material according to claim 10, wherein the light-sensitive material contains a hydrophilic colloid and the peeling means is brought into close contact with the light-sensitive material in the state that an amount of the developing solution per 1 g of the hydrophilic colloid is 50 ml or less.

12. A method of processing a light-sensitive material according to claim 1, wherein said light sensitive material is a lithographic printing plate having at least a silver halide emulsion layer on an anodized aluminum support and using a silver complex diffusion transfer process, wherein after coating a developing solution to effect development, bringing the peeling means into close contact for a contacting time within 3 seconds with the lithographic printing plate and peeling at least the silver halide emulsion layer by the peeling means.

13. The method of making a lithographic printing plate according to claim 12, wherein the silver halide emulsion layer comprises a hydrophilic colloid in an amount of 70% by weight or less based on the silver halide in terms of silver nitrate.

14. The method of processing a light-sensitive material according to claim 12, wherein the lithographic printing plate further comprises a protective layer on the silver halide emulsion layer.

15. The method of processing a light-sensitive material according to claim 1, wherein a contacting time of the peeling means to the light-sensitive material is about 1 second or shorter.

16. The method of processing a light-sensitive material according to claim 1, wherein the peeling means is a continuous length roll-state peeling sheet.

* * * * *